United States Patent [19]
Young et al.

[11] 3,940,590
[45] Feb. 24, 1976

[54] FUSED EYELETTING MACHINE

[75] Inventors: Loring E. Young, Jefferson; William Jordan Siegel, Silver Spring, both of Md.

[73] Assignee: Pace, Incorporated, Silver Spring, Md.

[22] Filed: July 16, 1974

[21] Appl. No.: 489,035

[52] U.S. Cl. .............................. 219/150 V; 74/520
[51] Int. Cl.² ........................................... B21J 5/08
[58] Field of Search ............ 74/520; 219/150 V, 86; 408/136

[56] References Cited
UNITED STATES PATENTS 1,252,143  1/1918  Murray et al. .................. 219/86

Primary Examiner—J. V. Truhe
Assistant Examiner—N. D. Herkamp
Attorney, Agent, or Firm—Fidelman, Wolffe & Waldron

[57] ABSTRACT

A fushed eyeletting machine which constitutes an improvement over the structure disclosed by U.S. Pat. No. 3,739,141, the improvement features being in the upper setting tool mount structure.

The upper arm of the C-shaped frame terminates in a pair of spaced apart tool support fingers, and a double stop toggle mechanism is mounted between the fingers, joined to a mandrel portion of the upper tool at a location thereon between the fingers.

The electrical connection to the upper tool is adjacent the tool top and above the fingers.

3 Claims, 5 Drawing Figures

U.S. Patent   Feb. 24, 1976   3,940,590
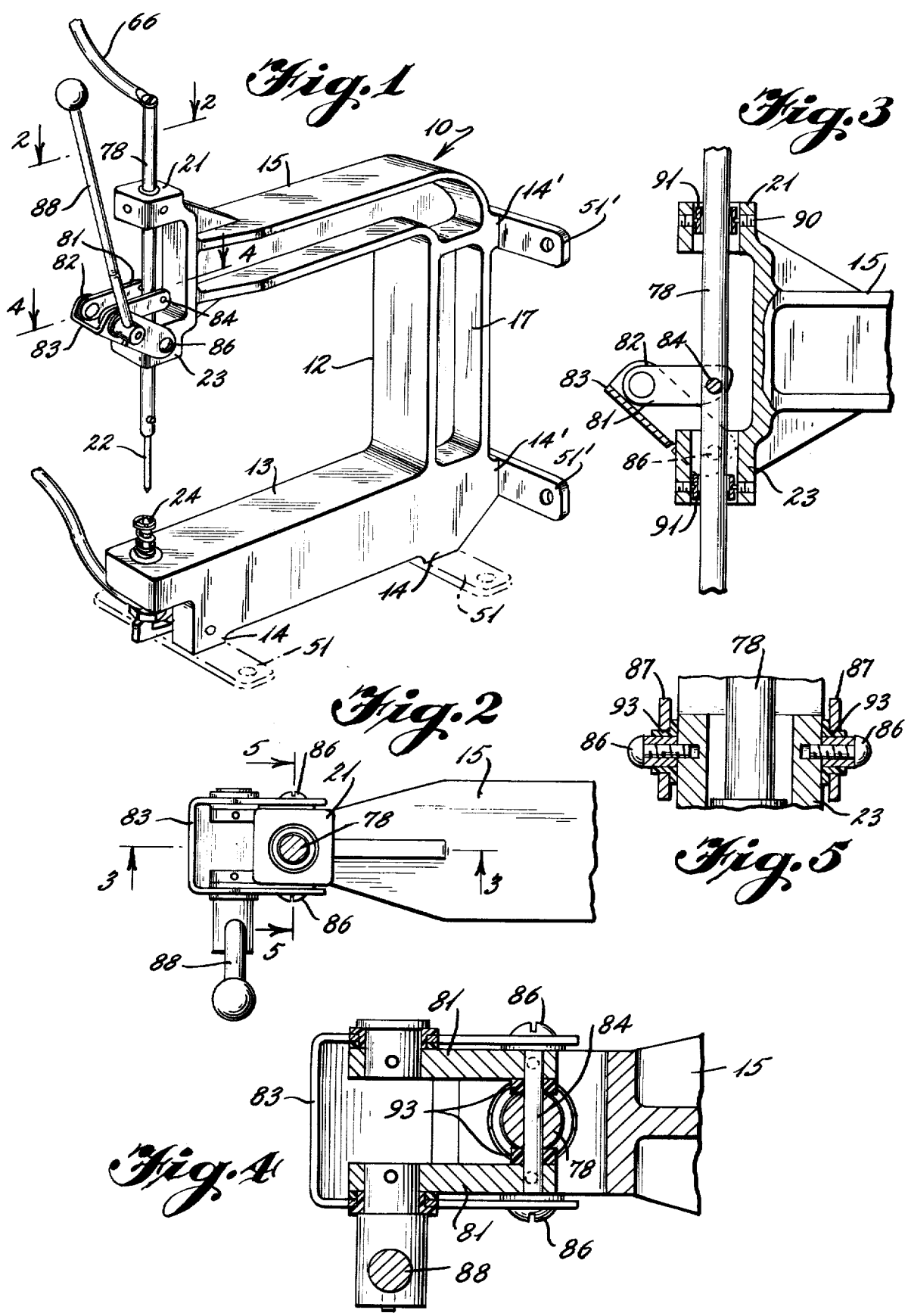

FUSED EYELETTING MACHINE

This invention relates to a fused eyeletting machine. In particular, this invention constitutes certain improvements over the fused eyeletting machine disclosed by U.S. Pat No. 3,739,141, issued June 12, 1973, reference being made thereto for a complete description of the machines as a whole.

Experience with the machine of U.S. Pat. No. 3,739,141 has indicated that the user may be somewhat inconvenienced by the structure of the upper tool mount, including notably the attachment of an electrical cable directly at the tool and adjacent the working region of the machine and with the limited working space between the tools available for work piece insertion purposes.

Experience with the machine of U.S. Pat. No. 3,739,141 has indicated also that users often desire to lay the machine on its back. Unfortunately, the design of the machine involved a relatively massive base, placement of the toggle structure above the upper arm, and attachment of an electrical connection to the upper tool mount, the total of which prevented efforts to satisfy users' desire for placing the machine on its back.

The object of the present invention is to provide a portable fused eyeletting machine with an electrical cable connection to the upper tool well spared from the tool.

A further object of this invention is to provide a portable fused eyeletting machine with an improved bearing and tool actuating structure for the upper tool.

Still another object is to provide a portable machine with a substantial tool gap for insertion of a work piece between the upper and lower tools.

Yet another object of this invention is to provide a balanced machine alternatively usable upright or on its back.

Further objects and the advantages will be apparent from the detailed description of the invention which follows.

Referring now to the drawing:

FIG. 1 is a perspective of an improved eyeletting machine as a whole;

FIG. 2 is an enlarged fragmentary plan view taken on the line 2—2 of FIG. 1;

FIG. 3 is an enlarged vertical section through the upper support arm taken on the line 3—3 of FIG. 2;

FIG. 4 is an enlarged horizontal section through the support arm of FIG. 3 taken on the line 4—4 of FIG. 1; and FIG. 5 is an enlarged fragmentary section taken on line 5—5 of FIG. 2.

As may be seen from FIG. 1, the machine 10 for setting eyelets and the like has a squared off C-shaped frame 12 which suitably is a cast member having lower arm 13, an upper arm 15 and a back 17 connecting the base ends of arms 13,15. At the bottom of frame 12 front and rear foot members 14 extend downward to receive plates 51 with screws so that eyeletting machine 10 may stand upright on a work table or other flat surface. A similar pair of foot members 14' extend outward from connecting back leg 17 where plates 51' may be screwed so the machine may rest on its back.

Since a complete description of the machine as a whole, and of all features associated with lower setting tool 24 is present in U.S. Pat. No. 3,739,141, reference being made for such purposes, no further description thereof need be provided here.

Attention is however directed to an improvement feature in the structure of back 17, namely presence of foot members 14' and plates 51' thereon. Machine 10 can be placed on its back, resting on the foot members 14' and plates 51' only because the size, weight, etc. of arms 13,15 and of back 17 have been related so that machine 10 is equally stable on either set of foot members 14,14'. In addition, operation of machine 10 when on its back has been made convenient by repositioning and restructuring of the upper tool mount and tool operating mechanism.

As may be seen in FIGS. 1 and 3, upper setting tool 22 is of extended length, including a mandrel portion 78 at the top of the tool. Optionally mandrel portion 78 and tool 22 may be separate members joined together. The forward end of the C-frame upper arm 15 terminates in a pair of spaced apart tool support fingers 21,23 through which mandrel portion 78 extends. Toggle mechanism 82 is pivotally secured by a pin 84 to mandrel 78, the securement pin 84 being disposed on that part of mandrel 78 which rides between fingers 21 and 23. Toggle mechanism 82 is pivotally secured also to the sides of lower finger 23 through attachment of links 87 by pins 86 (see FIG. 5). A flanged (nylon) bushing interposed between link 87 and pin 86 allows pivotal movement of toggle link 87. Toggle mechanism 82 is a double locking push-pull system. Up and down tool movement is stopped by contact of toggle links 81 with the cross plate 83 on the toggle limiting thereby each movement extreme by activating handle 88. The stop features constitute safety measures for machine 10 since the tool 22 moved by the toggle mechanism 82 into eyelet setting engagement is thereby prevented from applying excessive force to a work piece positioned between the setting tools 22,24.

Toggle handle 88 is mounted to the side of outside cross plate 83, while the toggle links 81 are inside the cross plate 83. Toggle handle 88 freely pivots alongside the upper tool mount and the upper arm 15, and in fact travels essentially 180° from the tool setting position when toggle handle 88 is alongside upper arm 15, lying generally parallel thereto, to the maximum tool open position when the toggle handle seems to be an extension of upper frame arm 15. It may be noted that the entire (180°) sweep of toggle handle 88 is above (the bottom edge of) lower finger 23, so that tool actuation by toggle mechanism 82 in no way interferes with a work piece disposed between the setting tools or manipulative movement of the work piece. The 180° sweep of toggle handle 88 creates a wide tool spacing (in open position), allowing relatively bulky work pieces to clear the setting tools. Normally the entire 180° sweep of handle 88 is not required. Pivoting toggle about 90° to the upright position shown in the drawing will spread the tools 22,24 enough for work piece insertion purposes.

In the fused eyeletting machine of the present invention the connection to electrical cable 66 is made at the top of mandrel 78, and the connection therefore is spaced well away from the working region between tools 22,24. The location of the toggle mechanism between fingers 21,23 on mandrel 78 leaves the top of mandrel 78 clear, allowing placement of the connection to cable 66 at the top of mandrel 78.

The mandrel 78 is, of course, electrically isolated from toggle mechanism 82 and support fingers 21,23 by insulator bushings and washers. FIG. 3 shows the (nylon) insulator bushings 91 that isolate mandrel 78 from fingers 21, 23. FIG. 4 shows the washers 93 (nylon) which isolate mandrel 78 from toggle links 81. Pin 84 may be made from a (phenolic) resin insulator material.

Bifurcation of the forward end of upper arm 15 into spaced apart electrode support fingers 21,23 improves the electrode support function of upper arm 15. Two well spaced apart bushing members 91 (of an electrically insulating nature such as nylon), one in each finger, guide tool 22 in the desired (exactly) rectilinear to and fro eyeletting setting movement relative to a circuit board or other work piece placed between tool 24,22. Adjustment in movement of tool 22 can, however, be made through the set screws 90 which serve to retain each bushing 91 in place, a set screw 90 being appropriately provided on each face of finger 21 and of finger 23.

Mounting the toggle connection of pin 84 between the guide and bearing bushings 91 facilitates true rectilinear movement reducing off-center forces on individual bushings. All told the upper tool mounting and actuating structure of the present invention is believed to be substantially superior to the comparable structure of the machine disclosed in U.S. Pat. No. 3,739,141.

What is claimed:

1. In a portable machine for setting eyelets and the like comprising a C-shaped frame adapted to rest on a work surface; a lower setting tool mounted on the lower arm of the frame, an upper setting tool opposing said lower tool movably mounted on the upper arm of the frame, and a manually operated stop arrested travel actuating means associated with said upper tool for moving said upper tool into setting engagement with said lower tool; the improvement which comprises:

a bifurcated upper arm of the frame split into two tool mounting fingers, a mandrel portion of said upper tool being mounted in apertures in said fingers movable relative thereto; and the travel actuating means mounted on the upper tool mandrel portion at a location thereon between said fingers.

2. In a portable machine for setting eyelets and the like comprising a C-shaped frame adapted to rest on a work surface; a lower tool mounted on the lower arm of the frame movable; an upper tool opposing said lower tool movably mounted on the upper arm of the frame, a manually operated stop arrested travel actuating means for moving said upper tool into setting engagement with said lower too, both said tools having electrical cables connected thereto, and both said tools being electrically isolated from the frame, the improvement which comprises:

a bifurcated upper arm of the frame split into two tool mounting fingers, a mandrel portion of said upper tool being mounted in apertures in said fingers movable relative thereto;

the travel actuating means mounted on the upper tool mandrel portion at a location thereon between said fingers; and the electrical cable connection to said upper tool being adjacent the top of said tool mandrel portion and above said fingers.

3. The portable machine of claim 1 wherein the back member of the C-shaped frame thereon is provided with foot members whereby the machine may be rested on its back.

* * * * *